United States Patent
Williams et al.

(10) Patent No.: US 9,935,246 B2
(45) Date of Patent: Apr. 3, 2018

(54) SILAZANE-CONTAINING MATERIALS FOR LIGHT EMITTING DIODES

(71) Applicant: Cree, Inc., Durham, NC (US)

(72) Inventors: Brad Williams, Cary, NC (US); Shaow B. Lin, Morrisville, NC (US)

(73) Assignee: Cree, Inc., Durham, NC (US)

( * ) Notice: Subject to any disclaimer, the term of this patent is extended or adjusted under 35 U.S.C. 154(b) by 728 days.

(21) Appl. No.: 14/143,820

(22) Filed: Dec. 30, 2013

(65) Prior Publication Data

US 2015/0188006 A1  Jul. 2, 2015

(51) Int. Cl.
| | |
|---|---|
| *H01L 33/56* | (2010.01) |
| *C08L 83/16* | (2006.01) |
| *H01L 33/50* | (2010.01) |
| *H01L 51/00* | (2006.01) |
| *H01L 51/52* | (2006.01) |
| *C08G 77/62* | (2006.01) |
| *C08G 77/16* | (2006.01) |

(52) U.S. Cl.
CPC .............. *H01L 33/56* (2013.01); *C08L 83/16* (2013.01); *C08G 77/16* (2013.01); *C08G 77/62* (2013.01); *H01L 33/501* (2013.01); *H01L 51/0043* (2013.01); *H01L 51/5253* (2013.01); *H01L 2251/5361* (2013.01); *H01L 2933/005* (2013.01); *H01L 2933/0058* (2013.01)

(58) Field of Classification Search
CPC ......... H01L 2251/5361; H01L 51/5253; H01L 2933/005; H01L 2933/0058; H01L 33/501; H01L 33/56; H01L 51/0043; H01S 5/00
See application file for complete search history.

(56) References Cited

U.S. PATENT DOCUMENTS

| | | | |
|---|---|---|---|
| 6,198,216 B1 | 3/2001 | Kosa et al. | |
| 6,268,432 B1 * | 7/2001 | Nakata ...................... | C08K 5/10 523/213 |
| 6,534,184 B2 | 3/2003 | Knasiak et al. | |
| 6,652,978 B2 | 11/2003 | Lukacs, III et al. | |
| 2005/0048016 A1 | 3/2005 | Lebreton et al. | |
| 2006/0255716 A1 | 11/2006 | Tsutsumi et al. | |
| 2007/0116968 A1 | 5/2007 | Dierdorf et al. | |
| 2008/0014461 A1 | 1/2008 | Brand et al. | |
| 2008/0107894 A1 | 5/2008 | Brand et al. | |
| 2010/0159255 A1 * | 6/2010 | Lee ........................ | C09D 183/04 428/447 |
| 2010/0276721 A1 * | 11/2010 | Yoshitake ............. | C08K 5/5425 257/99 |
| 2011/0311767 A1 * | 12/2011 | Elahee ..................... | C08K 5/11 428/138 |
| 2012/0018761 A1 | 1/2012 | Honda | |
| 2012/0165451 A1 * | 6/2012 | Igarashi ................... | C08K 3/36 524/262 |
| 2012/0256223 A1 | 10/2012 | Washizu | |
| 2013/0178595 A1 | 7/2013 | Yang et al. | |
| 2013/0221393 A1 | 8/2013 | Mao et al. | |
| 2013/0256742 A1 * | 10/2013 | Harkness ............... | C08G 77/20 257/100 |
| 2013/0287959 A1 * | 10/2013 | Fish ....................... | C09D 183/16 427/387 |
| 2013/0344632 A1 * | 12/2013 | Becker ..................... | C08K 5/12 438/26 |
| 2014/0021856 A1 * | 1/2014 | Jung .................. | H01L 51/5253 313/504 |
| 2014/0072812 A1 * | 3/2014 | Hamada .............. | H01S 5/02296 428/432 |

FOREIGN PATENT DOCUMENTS

| | | |
|---|---|---|
| WO | WO2011079020 A1 | 6/2011 |
| WO | WO2012067766 A2 | 5/2012 |

* cited by examiner

*Primary Examiner* — Donald Raleigh
*Assistant Examiner* — Kevin Quarterman
(74) *Attorney, Agent, or Firm* — Christopher J. Knors; Moore & Van Allen PLLC

(57) ABSTRACT

LEDs comprising polysilazane/polysiloxane copolymers and curable compositions containing same are disclosed. Methods of providing thermal and UV degradation resistance to said LED's, as well as increased luminous flux, is provided.

14 Claims, No Drawings

SILAZANE-CONTAINING MATERIALS FOR LIGHT EMITTING DIODES

TECHNICAL FIELD

This disclosure relates to mixtures of silazanes and polysiloxanes and their use as materials for light emitting diodes (LED) and LED devices.

BACKGROUND

Light emitting diode (LED) packages LEDs, components, and modules for lighting applications require high brightness and long term reliability. Conventional encapsulants by virtue of their chemical composition and molecular structure may allow undesirable degradation to occur upon prolonged exposure to heat and/or intense luminous flux of the LED components. Such degradation can adversely affect brightness, color rendering, reliability, shelf-life, and thermal properties of LED components and packages over time. Conventional in Solvents include silicones as phosphor-containing matrix material, and/or encapsulant, and/or dome for LEDs. However, performance limitations of silicones present challenges and barriers to advances of LED for general lighting applications in terms of brightness, color rendering stability, (LF) and long term reliability.

SUMMARY

In one embodiment, an LED device is provided. The LED device comprising at least one LED element and a cured mixture of at least one polysiloxane and at least one silazane or polysilzane.

In another embodiment, a method is provided. The method comprising contacting at least one LED element with a curable mixture of at least one silazane and at least one polysiloxane; and curing the curable mixture to provide a cured mixture.

DETAILED DESCRIPTION

Embodiments of the present disclosure now will be described more fully hereinafter with reference to the accompanying drawings, in which embodiments of the present disclosure are shown. This present disclosure may, however, be embodied in many different forms and should not be construed as limited to the embodiments set forth herein. Rather, these embodiments are provided so that this disclosure will be thorough and complete, and will fully convey the scope of the claims to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated' listed items.

It will be understood that when an element such as a coating or a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof. Unless otherwise defined, all terms (including technical and scientific terms) used herein have the same meaning as commonly understood by one of ordinary skill in the art to which this present disclosure belongs. It will be further understood that terms used herein should be interpreted as having a meaning that is consistent with their meaning in the context of this specification and the relevant art and will not be interpreted in an idealized or overly formal sense unless expressly so defined herein.

Unless otherwise expressly stated, comparative, quantitative terms such as "less" and "greater", are intended to encompass the concept of equality. As an example, "less" can mean not only "less" in the strictest mathematical sense, but also, "less than or equal to."

The terms "LED" and "LED device" as used herein may refer to any solid-state light emitter. The terms "solid state light emitter" or "solid state emitter" may include a light emitting diode, laser diode, organic light emitting diode, and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive materials. A solid-state lighting device produces light (ultraviolet, visible, or infrared) by exciting electrons across the band gap between a conduction band and a valence band of a semiconductor active (light-emitting) layer, with the electron transition generating light at a wavelength that depends on the band gap. Thus, the color (wavelength) of the light emitted by a solid-state emitter depends on the materials of the active layers thereof. In various embodiments, solid-state light emitters may have peak wavelengths in the visible range and/or be used in combination with lumiphoric materials having peak wavelengths in the visible range. Multiple solid state light emitters and/or multiple lumiphoric materials (i.e., in combination with at least one solid state light emitter) may be used in a single device, such as to produce light perceived as white or near white in character. In certain embodiments, the aggregated output of multiple solid-state light emitters and/ or lumiphoric materials may generate warm white light output having a color temperature range of from about 2200K to about 6000K.

The phrase "light diffusing particles" is used herein to be inclusive of particles of an index of refraction differing from that of the matrix material they are contained, dispersed, or distributed in. For example, in a matrix, e.g., the presently disclosed polymer matrixes, of a first index of refraction, light-diffusing particles of a second index of refraction differing by +/− about 0.3 to about 0.001, by about 0.3 to about 0.01, or about 0.3 to about 0.05, can be used. Other index of refraction deltas can be used within these ranges, for example, any possible integral of 0.001 between the upper and lower limits stated. Other combination of matrix material and particles of particular index of refraction can be used provided that the coating functions to diffuse light emitted by the LEDs. In certain aspects, the light diffusing particles, depending on their chemical composition and/or particle size and/or index of refraction, coupled with the incident angle of light emitted by the LED, are capable of providing scattering, diffusing, refracting and/or reflecting of one or more wavelengths of the light emitted by the LED. As used herein, the term "refracting" is inclusive of scattering, reflecting, and/or diffusing of impinging light.

The phrase "precursor component" is used herein interchangeably with "precursor" and refers without limitation to one or more materials or one or more compositions of matter that are capable of transitioning from a liquid to a solid or gel suitable for use in or with a light emitting device as a coating of, around, or about one or more components of the lighting device.

A solid-state lighting system may take the form of a lighting unit, light fixture, light bulb, or a "lamp." A solid-state lighting system includes an LED lighting system. An LED lighting system may include, for example, a packaged light emitting device including one or more light emitting diodes (LEDs), which may include inorganic LEDs, which may include semiconductor layers forming p-n junctions and/or organic LEDs (OLEDs), which may include organic light emission layers. Light perceived as white or near-white may be generated by a combination of red, green, and blue ("RGB") LEDs. Output color of such a device may be altered by separately adjusting supply of current to the red, green, and blue LEDs. Another method for generating white or near-white light is by using a lumiphor such as a phosphor. Still another approach for producing white light is to stimulate phosphors or dyes of multiple colors with an LED source. Many other approaches can be taken.

Polysilazane (PZ) is a class of silicon-based polymer material, however, it is generally found not suitable for LED applications, as it cures to a brittle material and has proven difficult to fabricate above a thickness of 1 micron without cure-related cracking. In addition PZ exhibits poor thermal stress under conditions suitable for LED lighting devices and packages. There are commercially available polysilazanes and silazanes, however, such materials are typically directed to providing precursors for ceramics. Generally, silazanes and polysilazanes have one or both of the following structures:

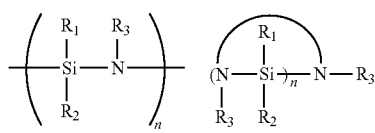

where $R_1$, $R_2$, and $R_3$ are the same or different and are each independently hydrogen or an optionally substituted alkyl, aryl; n is the number of monomeric repeating units and can be 2 to about 1000, typically for cyclic polysilazanes, about 5 to about 20.

Polysiloxanes have found general applicability as encapsulants for LED devices and packages. However, certain LED packages and configurations resulting discoloration e.g., yellowing that affects the overall performance and appearance of the LED device. Typically the discoloration is the result of one or more of intense exposure to the light from the LEDs (including UV light) and thermal cycling.

The present disclosure provides for the preparation and use of copolymers and/or block copolymers of silazane/polysilazane with siloxane/polysiloxane ("PZ-Si copolymer"). Representations of PZ-Si copolymers are as follows:

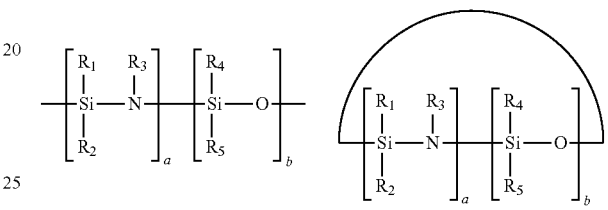

where $R_1$, $R_2$, $R_3$, $R_4$, and $R_5$ are the same or different and are each independently hydrogen or an optionally substituted alkyl, aryl or (trialkoxysilyl)alkyl radical; a and b are mole amounts of repeating unit, where a≠0. Typically for cyclic PZ-Si copolymers, the ring comprises from 5 to about 20 silazane/siloxane units. Such PZ-Si copolymers have been found after cure to exhibit excellent light and heat stability with significantly better physical/mechanical stability than either the polysilazane or polysiloxane material alone.

The present disclosure also provides for the modification and/or adjustment of the refractive index of the PZ-Si copolymer. By adjusting the refractive index (RI) of the PZ-Si copolymers, the brightness of the LED device or LED package is increased. In addition, the PZ-Si copolymers can be used as a phosphor-containing layer matrix material as well as a dome/globe or encapsulant material. The refractive index of the PZ-Si copolymers can be adjusted by modifying the mole percent of silazane to siloxane and/or phenyl substituents to that of methyl/alkyl substituents in the backbone of either of the siloxane/polysiloxane component of the PZ-Si copolymer.

Thus, in one aspect, modifying the mole percent of silazane to siloxane and/or percent phenyl in the siloxane/polysiloxane component of the PZ-Si copolymer provides a RI of between 1.41 to about 1.55. The absence of phenyl in the siloxane/polysiloxane component of the PZ-Si copolymer provides for example an RI of about 1.41. By modifying the ratio of the mole percent phenyl to mole percent methyl in the siloxane/polysiloxane component of the PZ-Si copolymer, RI can be adjusted between about 1.41 to about 1.55. Increasing the amount of siloxane in the PZ-Si copolymer decrease the RI.

In conventional silicone encapsulants, it is desirable to use the highest RI possible e.g., to use a high phenyl content as a component of an LED package or device so as to provide for improved luminous flux. However, the mechanical/thermal stability performance is just the opposite—high phenyl containing polysiloxanes have poor mechanical and thermal stability under typical operating conditions for LED devices and packages. While methyl-containing polysiloxanes provide better reliability performance then there phenyl-containing counterparts, methyl containing polysiloxanes exhibit lower luminous flux by virtue of their lower RI. It has surprisingly been found that LED devices comprising the present PZ-Si copolymers are brighter (e.g., have improved luminous flux) relative to LED devices comprising just polysiloxanes of similar or even higher RI. Moreover, the PZ-Si copolymers of the present disclosure when used in LED devices and packages showed excellent light stability (non-yellowing) and thermal resistance (cracking or discoloration) compared to LEDs comprising just polysiloxane.

The present methods allow for the preparation and use of PZ-Si copolymers with a range of RI, improved luminous flux and excellent optical and thermal qualities superior to that of just polysilazanes or polysiloxanes alone.

The present disclosure provides for one or more precursor components for the preparation and dispensing of the instant polysilazane/polysiloxane copolymers, which can include block or graft copolymers. Accordingly, precursor components can comprise at least one polysilazane monomer, oligomer, or polymer with at least one polysiloxane monomer, oligomer, or polymer. The precursors of the polysilazane and/or polysiloxane (or their respective monomer or oligomer) can be pre-reacted prior to use or can be configured to be combined during use so as to form the PZ-Si copolymer. The individual polysilazane and/or polysiloxane precursor materials can, independently or in combination, be configured with reactive groups to facilitate curing to form the PZ-Si copolymer suitable for use as an LED optical component in an LED device or package. Thus, the precursors can be configured to provide a curable mixture suitable for dispensing about an LED. Curing can be by exposure to ambient-conditions with or without the assistance of heat, moisture, light, vacuum, catalysts, or combinations thereof.

In one aspect, the PZ-Si copolymers are prepared from one or more silazane/polysilazane precursors and one or more siloxane/polysiloxane precursors, where one or both of the precursors comprise one or more chemically reactive groups suitable for reaction with the same and/or other precursors. In this context, "reactive groups" are those capable of combining to form covalent and/or non-covalent linkages between the respective components, and can include, for example, hydrolytically and/or catalytically active reactive silicon (Si) groups. Examples of reactive Si groups include alkoxyl, phenoxyl, acyl, halogen, hydride, alkylamino, etc. Examples of reactive Si groups typically requiring a catalyst include the combination of Si—H/vinyl groups and Si—H/acetylenic groups, etc. In another aspect, both the silazane/polysilazane and siloxane/polysiloxane precursors comprise one or both of Si—H and vinyl reactive groups.

These and further objects are accomplished by compositions of the present disclosure that comprises curable mixtures comprising at least one polysilazane and at least one polysiloxane configured to combine to form a polysilazane/polysiloxane copolymer. The sequential arrangement of the silazane/siloxane segments of the combined mixture of precursors can include simple A-B structures containing only two segments, and/or A-B-A and B-A-B triblock structures, and/or multi-block systems possessing many segments -(A-B)-$_n$. Many intermediate arrangements can result from the combination of the precursor mixture, including, for example, polymeric segments of the silazanes and polysiloxane attached end to end and/or in branched configuration and/or graft configuration where a plurality of siloxane chains append from the silazane backbone. Accordingly, the term "copolymer" hereinafter used is inclusive of block copolymers and graft copolymer variations thereof.

In one aspect, a composition is provided comprising "part A/part B" compositions, where a first part ("part A") comprises one or more silazane/polysilazane and a second part ("part B") comprises one or more siloxane/polysiloxane. The terms "part A" and "part B" are interchangeable. At least one of the silazane/polysilazane and siloxane/polysiloxane parts comprises functionalized end groups comprising the reactive substituents described above. Upon combination of the first part and the second part, the PZ-Si copolymers are formed by conversion of the functional groups to covalent and/or non-covalent coupling between the silazane/polysilazane and siloxane/polysiloxane precursors, which can also effectuate cure of the composition about the LEDs of the device or package.

As described above, the PZ-Si copolymers of this disclosure suitable for LED lighting devices and packages are made by combining one or more precursors comprising at least one silazane/polysilazane and at least one siloxane/polysiloxane. Any polysilazane or a mixture of polysilazanes known in the art or commercially available, having repeating units of Si—N linkages, can be used as precursor. By "polysilazane" is meant any oligomeric or polymeric composition comprising a plurality of Si—N repeat units. By "oligomer" is meant any molecule or chemical compound which comprises several repeat units, generally from greater than 2 to about 10 repeat units. The oligomeric or polymeric silazanes of this disclosure may be amorphous or crystalline, solid or liquid in nature. In one aspect, the polysilazane has at least one amine group, or, at least two terminal and primary amine groups as part of its composition, where the presence of at least one Si—N group within the molecule suffices.

Representative examples of polysilazanes that can be used include, but are not limited to, polymers commercially available and sold by KION (a division of Clariant, Japan). The polysilazanes (oligomers and polymers thereof) can comprise several different structures including linear, branched, ladder, and fused ring morphologies. The polysilazanes can be prepared by methods well-known in the art.

The precursors (and/or the resultant PZ Si copolymer) can comprise one or more cyclic, linear, or cyclo-linear structures. The precursor (poly)silazane can contain at least two amine groups through which they can polymerize with functional groups, such as hydroxyl groups of the polysiloxane precursor, although the presence of at least one Si—N bond within the polysilazane would suffice to promote such reactivity.

In another aspect, the one or more polysiloxane precursors comprising one or more Si—OH groups can be used with silazane precursors comprising an Si—NRH group (wherein R=hydrogen, alkyl, substituted alkyl, cycloalkyl, or a silicon-based radical, and preferably a silazane radical comprising a terminal Si—NH$_2$ group) so as to provide an Si—O—Si bond between the precursors and to facilitate cure. Thus, in a preferred embodiment of the present disclosure, polysilazanes are reacted with OH functional polysiloxanes to prepare PZ-Si copolymers in which the polysilazane and polysiloxane are joined by Si—O—Si bond linkages.

Although the above descriptions illustrates by example the reactivity of Si—OH group with a polysilazane, a variety of other reactive groups may be used to prepare the PZ-Si copolymers of the present disclosure, including, for example, —OH, —NH$_2$, —NRH, —CO$_2$H, —SH, and others to effect the desired covalent linkages between the silazane and the polysiloxane precursors of the present disclosure. While this group is representative of the types of moieties which can react with Si—N bonds in the polysilazanes used in the practice of this disclosure, it is not meant to be limiting. Indeed, any group which can cleave the Si—N bond can be used. The reactive group may be bonded directly to silicon, or may be present at the terminus of a non-Si-containing moiety bonded to silicon. For example, aminopropylsilyl is such an example of a polysiloxane which is terminated with reactive group having a non-Si containing moiety suitable for the practice of this disclosure.

The polysiloxane may contain a linear, branched or cross-linked polymeric system of alternating silicon and oxygen atoms having the general formulas and with various backbones, e.g. the M, T, Q, and D of Equation (1):

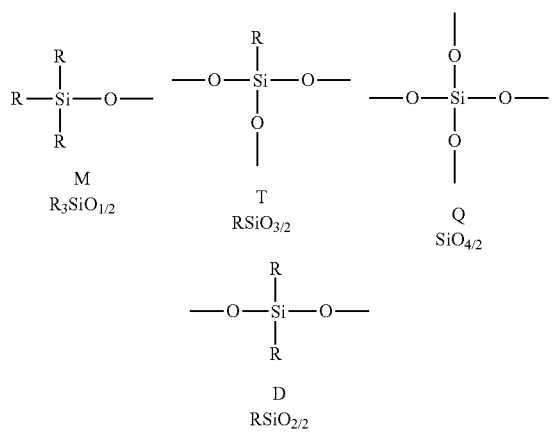

where R is independently the same or different and includes, but is not is limited to, hydrogen, a substituted or unsubstituted alkyl group, a substituted or unsubstituted cycloalkyl group, a substituted or unsubstituted alkenyl group and a substituted or unsubstituted aryl group, and the like, where R is, independently, alkyl or aryl, as well as the previously defined $R_1$-thru $R_5$ groups described above.

In certain aspects, the polysiloxanes contain multiple reactive groups, either along the backbone or at the terminus of the polymer chain, or both. Such reactive group-containing polysiloxanes are commercially available. For example, hydroxy- or amine-terminated polysiloxane of various viscosities, MW, and of variable backbone substituent content is commercially available from Gelest, Inc., Morrisville, Pa. Other examples of siloxane precursor components include, for example, one or more polymers and/or oligomers of silicones, e.g., polysiloxanes (e.g., polydialklysiloxanes (e.g., polydimethylsiloxane "PDMS"), polyalkylaryl siloxanes and/or polydiarylsiloxanes), or hybrids and/or copolymers thereof, or such materials in combination with other components. Examples of LED coatings include, without limitation, LIGHT CAP® LED Casting Resin 9622 acrylated polyurethane, (Dynamax Corp., Torringtion, Conn.); LPS-1503, LPS-2511, LPS-3541, LPS-5355, KER-6110, KER-6000, KER-6200, SCR-1016, ASP-1120, ASP-1042, KER-7030, KER-7080 (Shin-Etsu Chemical Co., Ltd, Japan); QSiI 216, QSiI 218, QSiI 222, and QLE 1102 Optically Clear, 2-part Silicone coating (ACC Silicones, The Amber Chemical Company, Ltd.), United Kingdom); LS3-3354 and LS-3351 silicone coatings from NuSil Technology, LLC (Carpinteria, Calif.); TSE-3032, RTV615, (Momentive Potting Silicone, Waterford, N.Y.); OE-6630, OE-6631, OE-6636, OE-6336, OE-6450, OE-6652, OE-6540, OE-7630, OE-7640, OE-7620, OE-7660, OE-6370M, OE-6351, OE-6570, JCR-6110, JCR-6175, EG-6301, SLY-GUARD silicone elastomers (Dow Corning, Midland, Mich.).

Preferably, the curable siloxane precursor component(s) are of low solvent content. More preferably, the siloxane curable precursor component(s) are essentially solvent-free. Essentially solvent-free is inclusive of no solvent and trace amounts of low volatility components, where trace amounts is solvent is present, but at an amount less than 5 weight percent, less than 1 weight percent, and less than 0.5 weight percent.

The PZ-Si copolymer can be prepared by mixing or otherwise combining the one or more precursors described above. The weight ratio of the silazane/polysiloxane precursors can be about 5:955 to about 95:5; the preferred silazane/polysiloxane precursor weight ratio is driven by the RI desired, which is a function of the Methyl/Phenyl content of the precursors, but can be approximately about 20:80 to about 80:20. When —OH or —$NH_2$ functional polysiloxanes are used to prepare the PZ-Si copolymers of the present disclosure, no catalyst is required, but one can be used. While the precursors may flow freely without added solvent, their viscosity can independently be reduced if desired by the addition of an aromatic hydrocarbon solvent such as toluene, xylene, an aliphatic hydrocarbon solvent such as heptane, decane, or dodecane, an ether solvent such as tetrahydrofuran or anisole, an ester solvent such as hexyl acetate or butyl propionate, or a ketone solvent such as acetone, methylethylketone, and the like. Also, no solvent is required during polymerization, but a solvent can be added to reduce viscosity, expedite curing, and/or aid in dispensing of the precursors or their mixture, if desired.

While reactions of the disclosure can be performed at temperatures approximating room temperature, or even below, reaction can be achieved by heating reaction mixtures to about 45° C., to about 100° C. The reaction typically requires from about one to about two hours. The reaction is complete when off gassing ceases.

The precursors can be "pre-combined" and/or "pre-reacted" prior to dispensing or use, and such pre-reacted compositions can be used in weight percent range from about 1 to about 75 percent by-weight, in a suitable solvent, for instance, hydrocarbon solvents, such as hexane, heptane, toluene, napthas and terpenes, ketones like acetone and methyl ethyl ketone, esters, such as methyl acetate and dimethyl adipate. Volatile, e.g., low MW cyclic siloxanes and volatile, low molecular weight linear siloxanes, alone or in combination with the above solvents, can also be used as solvents for the precursors or pre-combined compositions. The pre-combined compositions can be contacted with an LED, and the solvent evaporated. The precursor solutions can combined just prior to be contacted with an LED, and the solvent, if any evaporated. Either of the above can also be applied by spray, dip, or any other suitable coating technique known in the art.

Spectral Notch Materials, Light Diffusing Particles, and Phosphors,

The precursors, the pre-combined compositions of precursors, and the resultant PZ-Si copolymers can contain, independently, one or more of phosphors, spectral notch materials, and light diffusing particles.

In certain aspects, the curable coating and/or one or more precursor components comprise one or more of a light-diffusing particles and/or light-filtering agents and/or phosphor. Thus, in any one or more of the aforementioned precursor component embodiments or resultant coating, a light-diffusing particles and/or light-filtering agents and/or phosphor can be added, incorporated therein, associated therewith, and/or combined. It is understood that any of the previously described coatings or layers can be used alone or be used with other coatings or layers, which can be deposited on and/or between other coatings or layers as described.

Light-diffusing particles comprise, for example, particles with a high index of refraction. The PZ-Si copolymer matrix typically has a first index of refraction, and the light-diffusing particles have a second index of refraction differing from the polymer matrix by about 0.3 to about 0.1. In one aspect, the index of refraction of the light-diffusing particles can be between about 1.4-1.6. The average particle size of the light-diffusing particles can be between about 1 nanometer (nanoparticles) to about 500 microns. In preferred embodiments, the light-diffusing particles have an average particle size distribution between one micron and 25 micron. The light-diffusing particles can be added alone or in combination with other components such as a phosphor or light-filtering agent and added to the curable coating or to either part (Part A and/or Part B) or both parts of a two-part curable PZ-Si copolymer. The light-diffusing particles can be present between 0.1 to 15 weight percent, between about 0.5 to 12 weight percent, between about 1 to about 10 weight percent, or between about 1 to about 7 weight percent of the PZ-Si copolymer matrix. In certain aspects, light-diffusing particles can be present at about 1.5 to about 2.5 weight percent.

Examples of light-diffusing particles include, without limitation, fumed silica, fused quartz, fused silica, precipitated silica and/or other non-crystalline forms of silicon dioxide ($SiO_2$), which is also referred to generally as "silica." The particular name reflecting the process used to make them, e.g.: fused silica/fused quartz primarily prepared by electrical/melting process; fumed silica by flame process of silicate feed stocks, and precipitated silica by wet chemical reaction. Typically these forms of "silica" contain impurities. The typical impurities depend on the starting material and the process used. In one aspect, the presence of trace impurities does not substantially affect performance. In one aspect, the light diffusing particles are silica particles that are chemically treated to be hydrophobic or hydrophilic. Other light-diffusing particles suitable for use in the present disclosure include, for example, particles of sodium chloride, poly(methyl)acrylate, polycarbonate, and the like.

Light filtering agents may be used to provide a spectral notch. A spectral notch occurs is when a portion of the color spectrum of light passing through a medium is attenuated, thus forming a "notch" when the light intensity of the light is plotted against wavelength. Depending on the type or composition of glass or other spectral notch material used to form or coat the enclosure, the amount of light filtering agent present, and the amount and type of other trace substances in the enclosure, the spectral notch can occur between the wavelengths of 520 nm and 605 nm. In some embodiments, the spectral notch can occur between the wavelengths of 565 nm and 600 nm. In other embodiments, the spectral notch can occur between the wavelengths of 570 nm and 595 nm. Such systems are disclosed in U.S. patent application Ser. No. 13/341,337, filed Dec. 30, 2011, titled "LED Lighting Using Spectral Notching" which is incorporated herein by reference in its entirety. Examples of light filtering agents include, one or more lanthanide elements or lanthanide compounds and equivalents coated on or doped (incorporated in) the enclosure, the light-filtering agent is present at a loading sufficient to provide spectral notching. In other aspects, the light-filtering agent can be powder-coated on the interior surface of the enclosure, or the enclosure can be doped with the light-filtering agent or be contained in at least a portion of the thickness of the enclosure separating the interior and exterior surfaces of the enclosure. In yet other examples, the light-filtering agent can be included in a polymer matrix as described above or as disclosed in co-assigned U.S. application Ser. No. 13/837,379, filed Mar. 15, 2013, entitled "RARE EARTH OPTICAL ELEMENTS FOR LED LAMP," which is incorporated herein by reference in its entirety. In other aspects, the light-filtering agent can be coated on the interior or exterior of the enclosure, independently or in combination with the coating comprising light diffusing particles or other coatings or layers.

Depending on the LEDs used, the enclosure may be a glass or brittle ceramic or plastic, and/or doped with a rare earth (or lanthanide) compound or element, for example, a lanthanide oxide or other dichroic material, for example alexandrite ($BeAl_2O_4$).

In one aspect, the light-filtering agent is a lanthanide compound or element or compound of a rare earth element (collectively "REE"), oxide or nitride, etc. For example, neodymium oxide (or neodymium sesquioxide), neodymium(III) nitrate hexahydrate ($Nd(NO_3)_3.6H_2O$); neodymium (III) acetate hydrate ($Nd(CH_3CO_2)_3.xH_2O$); neodymium (III) hydroxide hydrate ($Nd(OH)_3$); neodymium(III) phosphate hydrate ($NdPO_4.xH_2O$); neodymium(III) carbonate hydrate ($Nd_2(CO_3)_3.xH_2O$); neodymium(III) isopropoxide ($Nd(OCH(CH_3)_2)_3$); neodymium(III) titanante ($Nd_2O_3$ titanate.$xTiO_2$); neodymium(III) chloride hexahydrate ($NdCl_3.6H_2O$); neodymium(III) fluoride ($NdF_3$); neodymium(III) sulfate hydrate ($Nd_2(SO_4)_3.xH_2O$); neodymium(III) oxide ($Nd_2O_3$); erbium(III) nitrate pentahydrate ($Er(NO_3)_3.5H_2O$); erbium(III) oxalate hydrate ($Er_2(C_2O_4)_3.xH_2O$); erbium(III) acetate hydrate ($Er(CH_3CO_2)_3.xH_2O$); erbium(III) phosphate hydrate ($ErPO_4.xH_2O$); erbium(III) oxide ($Er_2O_3$); Samarium(III) nitrate hexahydrate ($Sm(NO_3)_3.6H_2O$); Samarium(III) acetate hydrate ($Sm(CH_3CO_2)_3.xH_2O$); Samarium(III) phosphate hydrate ($SmPO_4.xH_2O$); Samarium(III) hydroxide hydrate ($Sm(OH)_3.xH_2O$); samarium(III) oxide ($Sm_2O_3$); holmium(III) nitrate pentahydrate ($Ho(NO_3)_3.5H_2O$); holmium(III) acetate hydrate (($CH_3CO_2)_3Ho.xH_2O$); holmium(III) phosphate ($HoPO_4$); and holmium(III) oxide ($Ho_2O_3$) can be used. Other REE compounds, including organometallic compounds of neodymium, didymium, dysprosium, erbium, holmium, praseodymium and thulium can be used.

Phosphors include, for example, commercially available YAG:Ce, although a full range of broad yellow spectral emission is possible using conversion particles made of phosphors based on the $(Gd,Y)_3(Al,Ga)_5O_{12}$:Ce system, such as the $Y_3Al_5O_{12}$:Ce (YAG). Other yellow phosphors that can be used for white-light emitting LED chips include, for example: $Tb_{3-x}RE_xO_{12}$:Ce(TAG), where RE is Y, Gd, La, Lu; or $Sr_{2-x-y}Ba_xCa_ySiO_4$:Eu.

Some phosphors appropriate for the LED lamp disclosed can comprise, for example, silicon-based oxynitrides and nitrides for example, nitridosilicates, nitridoaluminosilicates, oxonitridosilicates, oxonitridoaluminosilicates, and rare-earth doped sialons. Some examples include: $Lu_2O_3$: $Eu^{3+}(Sr_{2-x}La_x)(Ce_{1-x}Eu_x)O_4Sr_2Ce_{1-x}Eu_xO_4$ $Sr_{2-x}Eu_xCeO_4$ $SrTiO_3$:$Pr^{3+}$,$Ga^{3+}CaAlSiN_3$:$Eu^{2+}Sr_2Si_5N_8$:$Eu^{2+}$ as well as $Sr_xCa_{1-x}S:EuY$, where Y is halide; $CaSiAlN_3:Eu$; and/or $Sr_{2-y}Ca_ySiO_4:Eu$. Other phosphors can be used to create color emission by converting substantially all light to a particular color. For example, the following phosphors can be used to generate green light: $SrGa_2S_4:Eu$; $Sr_{2-y}Ba_ySiO_4:Eu$; or $SrSi_2O_2N_2:Eu$.

By way of example, each of the following phosphors exhibits excitation in the UV emission spectrum, provides a desirable peak emission, has efficient light conversion, and has acceptable Stokes shift, for example: Yellow/Green: $(Sr,Ca,Ba)(Al,Ga)_2S_4:Eu^{2+}Ba_2(Mg,Zn)Si_2O_2:Eu^{2+}$ $Gd_{0.46}Sr_{0.31}Al_{1.23}O_xF_{1.38}:Eu^{2+}_{0.06}$ $(Ba_{1-x-y}Sr_xCa_y)SiO_4:Eu$ $Ba_2SiO_4:Eu^{2+}$.

The lighting device can comprise solid-state light sources arranged with one or more phosphors so as to provide at least one of blue-shifted yellow (BSY), blue-shifted green (BSG), blue-shifted red (BSR), green-shifted red (GSR), and cyan-shifted red (CSR) light. Thus, for example, a blue LED with a yellow emitting phosphor radiationally coupled thereto and absorbing some of the blue light and emitting yellow light provides for a device having BSY light. Likewise, a blue LED with a green or red emitting phosphor radiationally coupled thereto and absorbing some of the blue light and emitting green or red light provides for devices having BSG or BSR light, respectively. A green LED with a red emitting phosphor radiationally coupled thereto and absorbing some of the green light and emitting red light provides for a device having GSR light. Likewise, a cyan LED with a red emitting phosphor radiationally coupled thereto and absorbing some of the cyan light and emitting red light provides for a device having CSR light.

A lighting system using the combination of BSY and red LED devices referred to above to make substantially white light can be referred to as a BSY plus red or "BSY+R" system. In such a system, the LED devices used include LEDs operable to emit light of two different colors. In one example embodiment, the LED devices include a group of LEDs, wherein each LED, if and when illuminated, emits light having dominant wavelength from 440 to 480 nm. The LED devices include another group of LEDs, wherein each LED, if and when illuminated, emits light having a dominant wavelength from 605 to 630 nm. A phosphor can be used that, when excited, emits light having a dominant wavelength from 560 to 580 nm, so as to form a blue-shifted-yellow light with light from the former LED devices. In another example embodiment, one group of LEDs emits light having a dominant wavelength of from 435 to 490 nm and the other group emits light having a dominant wavelength of from 600 to 640 nm. The phosphor, when excited, emits light having a dominant wavelength of from 540 to 585 nm. A further detailed example of using groups of LEDs emitting light of different wavelengths to produce substantially white light can be found in issued U.S. Pat. No. 7,213,940, which is incorporated herein by reference.

EXAMPLES

PZ-Si copolymers were prepared by reacting a hydroxyl-containing polymethylsiloxane fluid with polysilazane to form to a clear material. The precursors were combined to provide a homogeneous mixture of the two, then the mixture can be applied by dispensing, spraying, or molding over LED dies, components, followed by subsequent curing at temperatures 150° C. or higher. As summarized in Table 1, compositions comprising various weight percentages polysiloxane and silazane were prepared, with the samples having refractive indexes varying between 1.41 and 1.55.

TABLE 1

Measured refractive index of various PZ-Si copolymer compositions versus controls.

| PZ-Si Copolymer Composition | Siloxane/Silazane weight ratio | Refractive Index |
|---|---|---|
| polysilazane control | 0 | 1.5 |
| Polysilazane-polysiloxane | 5.5 | 1.499 |
|  | 10.4 | 1.493 |
|  | 20.6 | 1.485 |
|  | 30 | 1.478 |
|  | 30.5 | 1.478 |
|  | 40.3 | 1.467 |
|  | 49.9 | 1.466 |
|  | 75 | 1.455 |
| Polydimethylsiloxane (hydroxy terminated) | 100 | 1.439 |

To the PZ-Si copolymer above was dispersed NYAG phosphor and this composition was sprayed over EZ1350 dies (CREE, Durham, N.C.) and cured. For certain experiments, these test LED samples were over molded with either "high phenyl silicone" (OE6636) or "low phenyl silicone" (KER6075) to provide domes. Likewise, XPGB LEDs were prepared using a PZ-Si copolymer as dome. These test samples compared with controls comprising domes not containing polysilazane, as shown in Table 2, where the brightness of PZ-Si copolymers compared favorably over controls, which surprisingly did not correspond as expected to the refractive index of the particular materials. Thus, with an RI of 1.47 the presently disclosed PZ-Si copolymers surprisingly provided superior luminous flux compared with materials of higher RI, including that of essentially polysilazane homopolymer.

TABLE 2

Measured refractive index and luminous flux of fabricated LED devices comprising PZ-Si copolymer coatings versus controls.

| Overlayer Material | Refractive Index (@589 nm) | Luminous Flux |
|---|---|---|
| Polydimethyl siloxane polymer | 1.41 | 151.2 |
| Polyphenylsiloxane polymer (low phenyl content) | 1.45 | 156.1 |
| Polysilazane-polysiloxane (2 parts:1 part) | 1.47 | 158.4 |
| Polyphenylsiloxane polymer (medium phenyl content) | 1.50 | 153.2 |
| Polyphenylsiloxane polymer (high phenyl content) | 1.55 | 156.6 |

Thermal stress testing of the PZ-Si copolymers revealed that the incorporation of polysiloxane into polysilazane materials greatly improved the thermal resistance properties of the material making it ideally suited for LED applications. As shown in Table 3, the presently disclosed PZ-Si copolymers provided thick (>1 mm thick) coatings, for example, 1-3 millimeters thick, or 3-5 millimeters thick, or 6-10 millimeters thick, that were found to provide excellent thermal resistance under thermal stress conditions of 230° C. and 280° C. hot plate reflow (e.g., did not crack, split, delaminate, or discolor). In contrast, thick films of just polysilazane polymer cracked or split under the same thermal stress test—indicating such polymers may not be suitable as LED coatings, domes, etc. It should be noted that while polydimethyl siloxanes, and polyphenylsiloxanes (low phenyl Si, med phenyl Si, and high phenyl Si) showed no cracking, shrinkage, or discoloration under these test condition, and are all useful LED dome materials, surprisingly, the presently disclosed PC SI copolymers improved the luminous flux of identical LED devices in direct comparison testing with polydimethyl siloxanes and polyphenylsiloxanes.

TABLE 3

Observed changes in dome appearance after thermal stress testing of fabricated LED devices comprising PZ-Si copolymer coatings versus controls.

| Sample | 230° C. Thermal Stress Test | 280° C. Thermal Stress Test |
|---|---|---|
| polysilazane control | Cracking; shrinking; discoloration | Cracking; shrinking; discoloration |
| Polysilazane-polysiloxane | No cracking; to shrinking; no discoloration | No cracking; to shrinking; no discoloration |
| Polyphenylsiloxane polymer (high phenyl content) | No cracking; to shrinking; no discoloration | No cracking; to shrinking; no discoloration |

The presently disclosed PZ-Si copolymers also provided excellent accelerated UV resistance performance. As shown in Table 4, the change in percent transmission@400 and 450 nm after 120 hours UV exposure was essentially zero for the PZ-Si copolymers whereas controls (medium-, low-phenyl content polyphenylsiloxanes showed significant UV discoloration/degradation as evidenced by significant changes in Delta-transmission.

TABLE 4

Maintained excellent % Transmission @ 450 nm and @ 400 nm upon accelerated UV exposure

| Sample | Delta % Transmission@ 400 nm (120 hours UV exposure) | Delta % Transmission@ 450 nm (120 hours UV exposure) |
|---|---|---|
| Polyphenylsiloxane polymer (medium phenyl content) | >15 | >15 |
| Polysilazane-polysiloxane | 0 | 0 |
| Polyphenylsiloxane polymer (low phenyl content) | >10 | >10 |

The presently disclosed PZ-Si copolymers have been demonstrated as suitable phosphor layer matrix material (binder, matrix) for conventional LED chip dies (e.g., Cree's WZ series, XBright and XThin series, and EZ series LEDs, as well as an encapsulant/lens/domes/protective coating for LED elements, packages, and devices, such as for example, the XLamp as sold by Cree.

While the disclosure has been described in conjunction with various embodiments, they are illustrative only. Accordingly, many alternatives, modifications and variations will be apparent to persons skilled in the art in light of the foregoing detailed description, and it is therefore intended to embrace all such alternatives and variations as to fall within the spirit and broad scope of the appended claims.

We claim:

1. A method comprising
   contacting at least one LED element with a curable mixture of at least one silazane and at least one polysiloxane; and
   curing the curable mixture to provide an optically transparent cured mixture, wherein the cured mixture is a copolymer of the at least one silazane and the at least one polysiloxanes having the formula I or II:

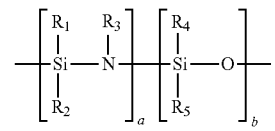

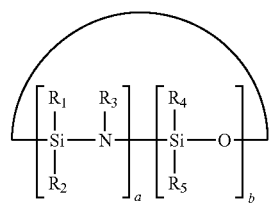

wherein $R_1$, $R_2$, $R_3$, $R_4$, and $R_5$ are the same or different and are each independently hydrogen or an optionally substituted alkyl, aryl, or (trialkoxysilyl)alkyl radical; a and b are mole amounts of repeating unit, and a≠0;
   exposing the cured mixture to UV light from the at least one LED elements; and
   preventing or eliminating discoloration of the cured mixture as measured by a change in percent transmission at 400 nm and/or 450 nm of less than 10 percent after 120 hours.

2. The method of claim 1, wherein the cured mixture has an index of refraction of between 1.41 and 1.55.

3. The method of claim 1, further comprising: exposing the at least one LED element to temperature of about 230° C. to about 280° C.; and reducing or eliminating cracking and discoloration of the cured mixture.

4. The method of claim 1, further comprising: improving the luminous flux of the at least one LED element at least 1 percent compared to a substantially similar LED element coated with a polysilazane coating or a polysiloxane coating of substantially similar refractive index.

5. The method of claim 1, wherein the at least one silazane of the curable mixture is polysilazane.

6. The method of claim 5, wherein the polysilazane contains one or more of reactive groups selected from the group consisting of Si—H, amine, alkylamine, hydroxy, alkoxy, thiol, vinyl, acrylate, acrylamide, and halogen.

7. The method of claim 1, wherein the at least one polysiloxane of the curable mixture contains one or more of reactive groups selected from the group consisting of Si—H, amine, alkylamine, hydroxy, alkoxy, thiol, vinyl, acrylate, acrylamide, and halogen.

8. The method of claim 1, wherein the at least one polysiloxane of the curable mixture is hydroxy-terminated, alkoxyl-terminated, or alkylamine.

9. The method of claim 1, wherein the optically transparent cured mixture is a chemical reaction product of the at least one polysiloxane and the at least one silazane.

10. The method of claim 1, further comprising depositing one or more optically transparent layers on the optically transparent cured mixture, the one or more layers comprising, independently or in combination, a polymethylsiloxane layer, a polyphenylsiloxane layer, or a polyphenylmethylsiloxane layer.

11. The method of claim 1, wherein the optically transparent cured mixture further comprises one or more of each of a phosphor, a spectral-notch filtering material, and a reflective/refractive material.

12. The method of claim 10, wherein the one or more optically transparent layers further comprises one or more of each of a phosphor, a spectral-notch filtering material, and light diffusing particles.

13. The method of claim 1, further comprising the step of forming the curable mixture or the cured mixture into an optical element.

14. The method of claim 1, wherein the cured mixture encapsulates the at least one LED element.

* * * * *